United States Patent [19]
Faucher

[11] Patent Number: 5,959,845
[45] Date of Patent: Sep. 28, 1999

[54] UNIVERSAL CHIP CARRIER CONNECTOR

[75] Inventor: Marc R. Faucher, South Burlington, Vt.

[73] Assignee: International Business Machines Corporation, Armonk, N.Y.

[21] Appl. No.: 08/933,216

[22] Filed: Sep. 18, 1997

[51] Int. Cl.[6] ................................................. H05K 7/02
[52] U.S. Cl. ........................ 361/777; 361/772; 361/783; 174/261; 257/686; 257/692; 257/723; 257/786
[58] Field of Search .................................. 361/777, 767, 361/772, 783; 174/261; 257/685, 686, 692, 723, 724, 773, 777, 786; 439/55, 217

[56] References Cited

U.S. PATENT DOCUMENTS

| | | | |
|---|---|---|---|
| 3,716,761 | 2/1973 | Rotast | 361/777 |
| 4,613,924 | 9/1986 | Brault | 361/777 |
| 5,237,131 | 8/1993 | Catlin | 174/261 |
| 5,258,891 | 11/1993 | Sako | 361/767 |
| 5,323,060 | 6/1994 | Fogal et al. | 257/777 |
| 5,490,040 | 2/1996 | Gaudenzi et al. | 361/773 |
| 5,515,241 | 5/1996 | Werther | 361/784 |
| 5,541,814 | 7/1996 | Janai et al. | 361/777 |
| 5,557,505 | 9/1996 | Silva | 361/777 |
| 5,721,452 | 2/1998 | Fogal et al. | 257/723 |
| 5,751,557 | 5/1998 | Silva | 361/777 |
| 5,754,408 | 5/1998 | Derouiche | 361/783 |
| 5,801,927 | 9/1998 | Watanabe | 361/777 |

OTHER PUBLICATIONS

*Dual–In–Line Package Socket "Piggyback" Structure,* D.J. McAtee, IBM Technical Disclosure Bulletin. p. 1315, vol. 16 No. 4, Sep. 1973.
*Module Interconnection Using Hybrid Attachment,* R.A. Foster, E. Tayar, G. Schrottke, IBM Technical Disclosure Bulletin, pp. 330–331, vol. 35 No. 7, Dec. 1992.

*Primary Examiner*—Leo P. Picard
*Assistant Examiner*—John B. Vigushin
*Attorney, Agent, or Firm*—DeLio & Peterson LLC; Peter W. Peterson; James M. Leas

[57] ABSTRACT

A circuit board for receiving different chip modules at each chip module site has a site for receiving a chip module having electrical connectors thereon and a first set of contacts at the chip module site having a first arrangement for receiving a chip module having an electrical connector footprint conforming to the first module contact arrangement. There is also provided a second set of contacts at the chip module site having a second arrangement for receiving a chip module having an electrical connector footprint conforming to the second module contact arrangement, the second set of contacts having a different arrangement than, and being electrically connected to, the first set of contacts.

29 Claims, 4 Drawing Sheets

UNIVERSAL CHIP CARRIER CONNECTOR

BACKGROUND OF THE INVENTION

1. Field of the Invention

This invention relates to a printed circuit board for receiving chip modules and in particular to a circuit board which is configured to receive different chip modules at each chip module site.

2. Description of Related Art

Manufacturers of printed circuit boards typically have to work with a selection of chip modules having different configurations of electrical connectors as well as different arrangements of the electrical connector footprints for connection to the corresponding contacts on the printed circuit boards. As used herein, the terms "contact arrangement" or "connector arrangement" refers to the pattern of the individual connectors or contacts, including the number and location of such contacts or connectors. As used herein, the term "contact configuration" or "connector configuration" refers to the type of physical and electrical connector utilized between the chip module and the printed circuit board, for example, pin grid arrays (PGA), ball grid arrays (BGA), micro BGAs (denser than typical BGAs), column grid arrays (CGA) or direct die attachment. An example of BGA contacts or connectors is the controlled chip collapse connection or C-4 technology which is often referred to in the industry as flip-chip technology. The BGA or C-4 connectors are made of solder balls which electrically and physically connect the chip module to the printed circuit board. CGA connectors are also made of solder, but in a column configuration rather than a ball configuration. Both BGA and CGA connectors must be heated to solder softening temperature in order to make the connection between a chip module and a printed circuit board. On the other hand, PGA connectors utilize pins on the chip module which are removeably received within socket contacts mounted in the printed circuit board. As used herein, "chip module" refers to both single chips to be connected to a circuit board as well as multiple chip arrays mounted on substrate bases, which bases are then subsequently connected to the circuit board.

A microprocessor chip module may be available from one company with PGA connectors and from another company in a BGA package. A board manufacture may want to use either part as a source. However, in order to do this, such manufacturer has had to either manufacture two different circuit boards, one for each of the PGA and BGA packages or, alternatively, build a "daughter" or conversion board to transform either the PGA footprint into the BGA footprint, or vice-versa, at the chip module receiving site on the board. An example of the latter is shown in U.S. Pat. No. 5,515,241. Both of these alternatives involve extra cost to the circuit board manufacturer.

Bearing in mind the problems and deficiencies of the prior art, it is therefore an object of the present invention to provide a circuit board capable of receiving different chip modules at each chip module receiving site.

It is another object of the present invention to provide a circuit board which may receive PGA, BGA and/or CGA chip modules at each module site.

A further object of the invention is to provide a combination BGA/PGA/CGA module receiving site which is easier and less expensive to construct on a circuit board.

SUMMARY OF THE INVENTION

The above and other objects, which will be apparent to those skilled in the art, are achieved in the present invention which relates to a circuit board for receiving different chip modules at each chip module site comprising a circuit board having a site for receiving a chip module having electrical connectors thereon and a first set of contacts at the chip module site having a first arrangement for receiving a chip module having an electrical connector footprint conforming to the first module contact arrangement. There is also provided a second set of contacts at the chip module site having a second arrangement for receiving a chip module having an electrical connector footprint conforming to the second module contact arrangement, the second set of contacts preferably having a different arrangement than, and being electrically connected to, the first set of contacts.

In another aspect, the present invention provides a circuit board for receiving different chip modules at each chip module site comprising a circuit board having a site for receiving a chip module having electrical connectors thereon, a first set of contacts at the chip module site having a first arrangement for receiving a chip module having an electrical connector footprint conforming to the first module contact arrangement, and a second set of contacts at the chip module site having a second arrangement for receiving a chip module having an electrical connector footprint conforming to the second module contact arrangement, the second set of contacts having a different arrangement than, and surrounding, the first set of contacts.

Optionally, there may be provided a further set of contacts at the chip module site having a different arrangement than the first and second contacts, and being electrically connected to the first set of contacts for receiving a chip module having an electrical connector footprint conforming thereto.

The second set of contacts may surround the first set of contacts and may have a different configuration than the first set of contacts. The first set of contacts may have a configuration chosen from the group consisting of BGA, micro BGA, CGA, PGA and direct die attachment, and the second set of contacts may have a configuration chosen from the group consisting of BGA, micro BGA, CGA, PGA and direct die attachment, but of a different configuration than the first set of contacts. The electrical connections between the first and second sets of contacts may also comprise fusible or other links.

In yet another aspect the present invention provides a circuit board and chip module combination preferably comprising a circuit board having a site for receiving a chip module having electrical connectors thereon, a first set of PGA contacts arranged near the periphery of the chip module site and a second set of contacts having a configuration selected from the group consisting of BGA, micro BGA, CGA and direct die attachment contacts arranged within the first set of contacts at the chip module site. A first chip module having PGA connectors conforming to the first PGA contact arrangement is in physical and electrical connection with the first set of PGA contacts, and the first chip module electrical connectors being out of physical contact with the second set of contacts. A second chip module having connectors conforming to the second contact arrangement is in physical and electrical connection with the second set of contacts, and the second chip module electrical connectors being out of physical contact with the first set of contacts. The PGA connectors of the first chip module may extend outward from the periphery of the first chip module, such that the second chip module is disposed between the first chip module and the circuit board and extends outward beyond the periphery of the first chip module.

In a further aspect, the present invention relates to a method of attaching different chip modules having electrical connectors at a chip module site on a carrier. First, there is provided a carrier having a first set of contacts at a chip module site with a first module contact arrangement for receiving a chip module having an electrical connector footprint conforming to the first module contact arrangement. A second set of contacts at the chip module site has a second module contact arrangement for receiving a chip module having an electrical connector footprint conforming to the second module contact arrangement. A chip module has an electrical connector footprint conforming to the first module contact arrangement. The chip module is placed in physical and electrical contact with the first set of contacts such that the chip module electrical connectors are out of physical contact with the second set of contacts, thereby leaving the second set of contacts available for receiving a second chip module having an electrical connector footprint conforming to the second module contact arrangement.

The method may include the step of electrically connecting the second set of contacts to the first set of contacts. The second set of contacts may have a different arrangement than the first set of contacts, and the second set of contacts may surround the first set of contacts. There also may be provided an additional set of contacts at the chip module site having a different arrangement than the first and second contacts, and being electrically connected to the first set of contacts for receiving a chip module having an electrical connector footprint conforming thereto.

The method may further include the steps of providing a second chip module having an electrical connector footprint conforming to the second module contact arrangement and placing the second chip module in physical and electrical contact with the second set of contacts, the chip module electrical connectors being out of physical contact with the first set of contacts.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS

In describing the preferred embodiment of the present invention, reference will be made herein to FIGS. 1–8 of the drawings in which like numerals refer to like features of the invention. Features of the invention are not necessarily shown to scale in the drawings.

Figure 1:
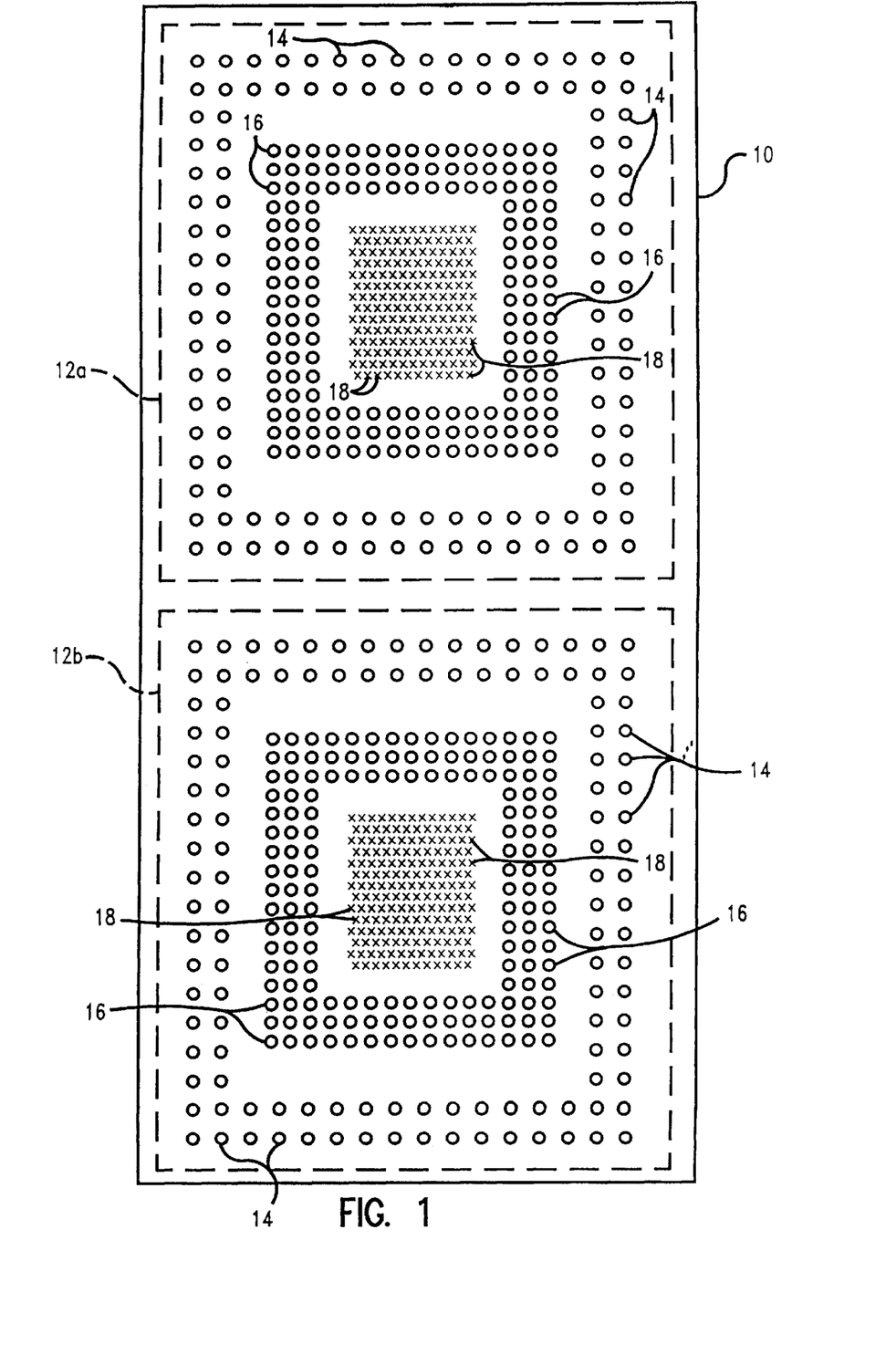
FIG. 1 is a top plan view of a printed circuit board having thereon a pair of chip module sites constructed in accordance with the present invention.

In accordance with the present invention, there is provided at each chip module receiving site on a carrier a plurality of contact footprints of multiple configurations and/or arrangements for receiving different chip modules having differing electrical connector configurations and arrangements. As used herein, the term carrier refers to a structure used to receive and electrically connect a chip module to another module or circuit, and includes a laminated or other circuit board, a ceramic carrier, or a plastic structure such as a flex cable. In FIG. 1, there is depicted one embodiment of a carrier such as a printed circuit board 10 having thereon a pair of chip module-receiving sites, 12a, 12b. Within each site 12a, 12b there are provided a plurality of configurations of contacts for receiving the corresponding electrical connectors of different chip modules. A first set of contacts 14, for example, pin or PGA contacts, is provided near the outer periphery of the site in a double row rectangular arrangement. Within and surrounded by the PGA contacts there is provided a second set of contacts 16, for example, of the solder ball or BGA configuration disposed in a three row rectangular arrangement. Within and surrounded by the BGA contacts there is provided solder columns or CGA contacts 18 disposed in a rectangular configuration. Different numbers of contacts and arrangements and configurations other that shown may be utilized in accordance with the present invention. Different arrangements of contacts can comprise different row patterns than those shown. Different contact configurations can comprise micro BGA, direct die attachment and other known types of physical and electrical connection.

Figure 2:
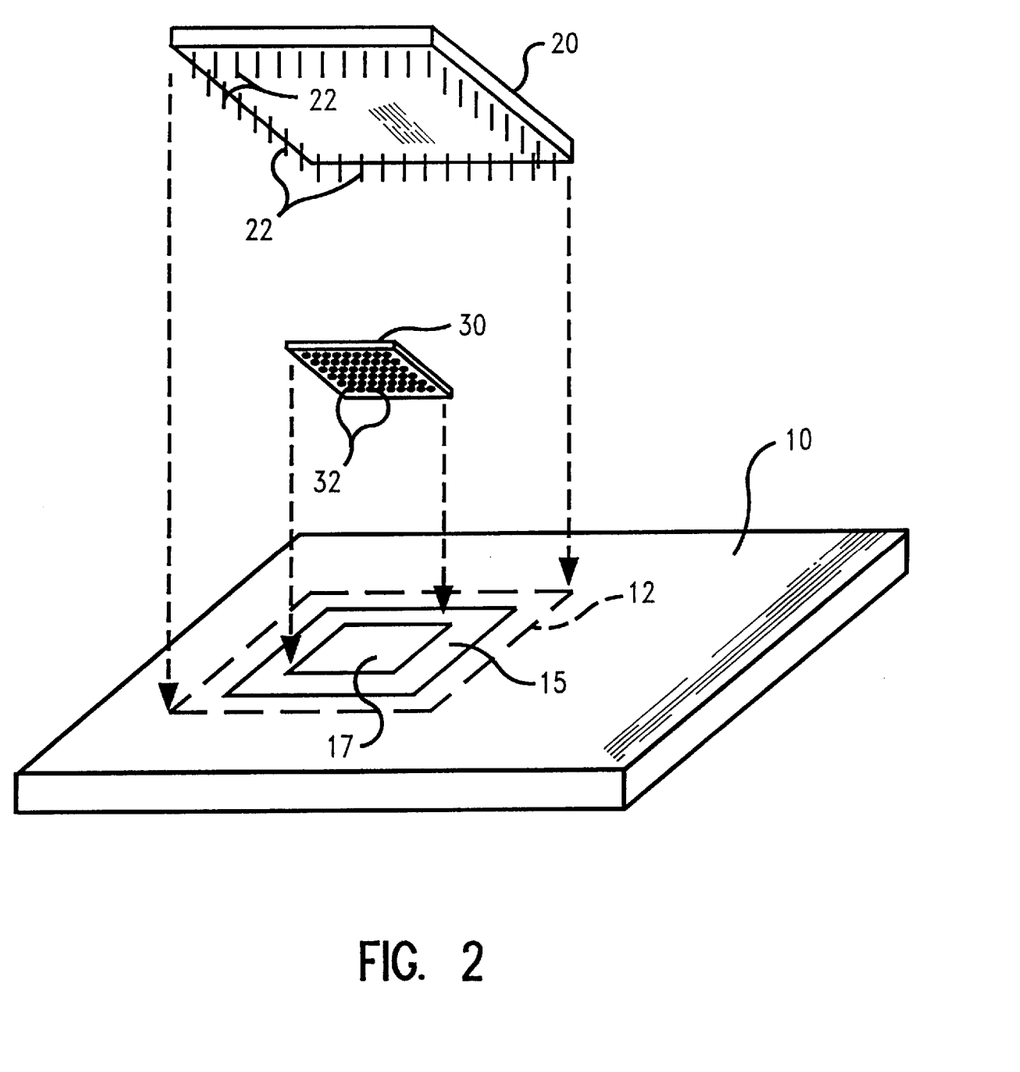
FIG. 2 is an exploded perspective view of a circuit board receiving different chip module configurations and arrangements at a single chip module site.

In FIG. 2 there is shown the mounting of two chip modules onto a single chip site 12 on circuit board 10. A module 20 having PGA type connectors 22 may be mounted onto corresponding connectors of comparable configuration and arrangement of PGA sockets in contact site area 15. There is also shown a chip module 30 having BGA type or configuration connectors 32, which may be mounted and received within a corresponding configuration and arrangement of BGA contacts in site area 17. Either of the chip modules 20 or 30 may be individually utilized at contact site 12. Alternatively, chip modules 20 and 30 may be designed for simultaneous mounting at the same chip site 12, with chip 30 below chip 20 and between chip 20 and board 10. Such an arrangement would save board space and provide a level of security for the flip chip module 30, for example, in an encryption application.

Figure 3A:
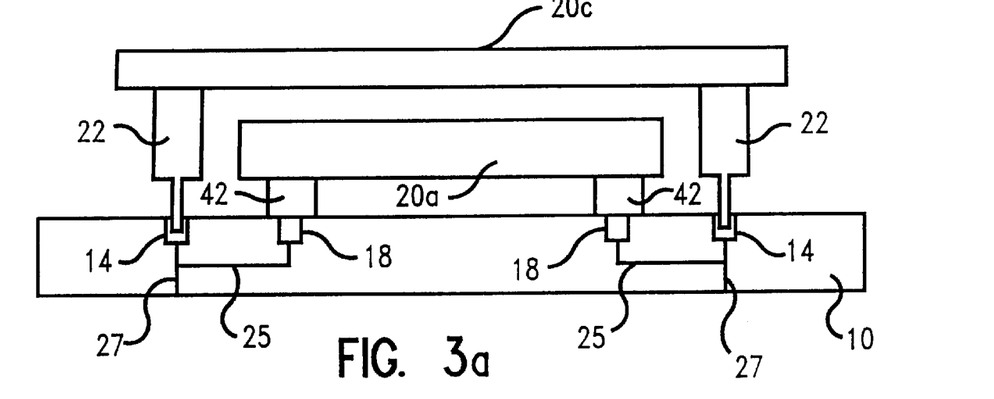
FIGS. 3a, 3b and 3c are elevational views of chip modules and printed circuit boards having different connector and contact configurations.
Figure 3B:
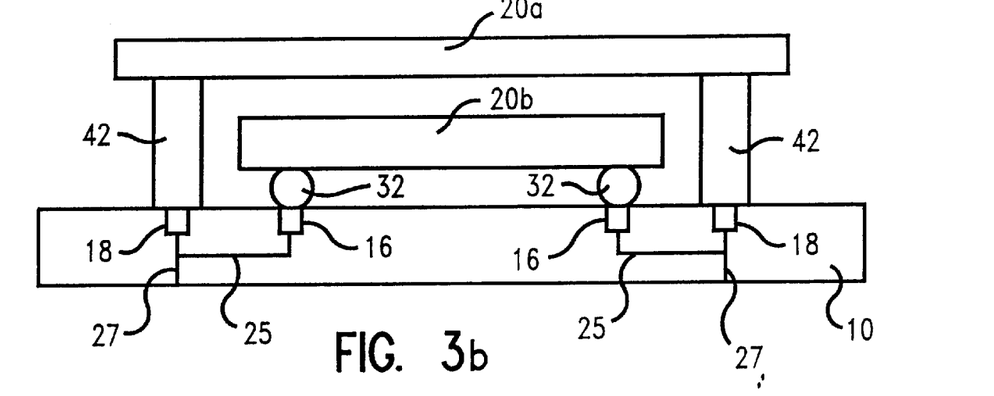
Figure 3C:
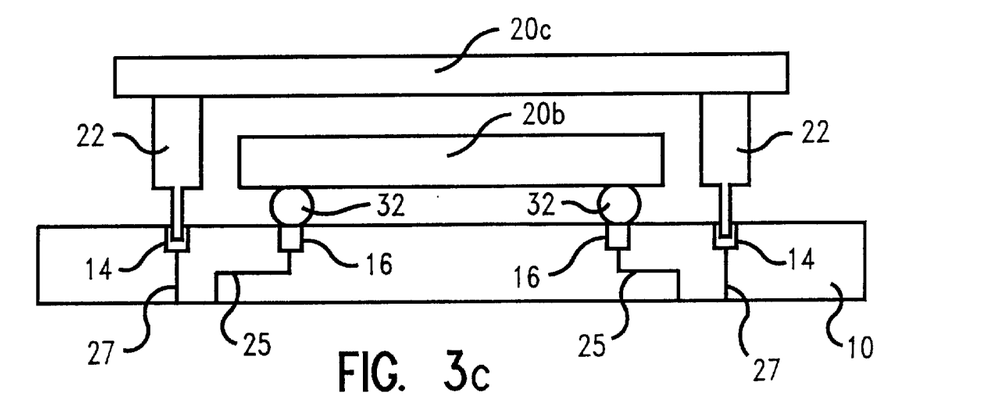

In FIGS. 3a, 3b and 3c there are depicted non-limiting examples of the different configurations of chip module connectors and circuit board contacts which may be utilized in accordance with the present invention. Circuit board 10 contains a combination of a plurality of pin or PGA connectors 14 and solder column or CGA connectors 18 (FIG. 3a), a combination of a plurality of solder ball or BGA connectors 16 and solder column or CGA connectors 18 (FIG. 3b), or a combination of a plurality of pin or PGA connectors 14 and solder ball or BGA connectors 16 (FIG. 3c), all at one chip site. Different chip modules may subsequently be mounted and received at the same chip site. For example, in FIG. 3a, a chip module 20a containing CGA connectors 42 would connect to the corresponding CGA contacts 18 on board 10 and, above and surrounding module 20a, chip module 20c having PGA connectors 22 may be received at PGA contacts 14 at the same site on board 10. Electrical leads 25 connected to contacts 18 are also connected to corresponding leads 27 connected to contacts 14. In FIG. 3b, chip module 20b having BGA connectors 32 may be received at the BGA contacts 16 on board 10 and, above and surrounding module 20b, chip module 20a having CGA connectors 42 may be received at CGA contacts 18 at the same site on board 10. Electrical leads 25 connected to contacts 16 are also connected to corresponding leads 27 connected to contacts 18. In FIG. 3c, chip module 20b having BGA connectors 32 may be received at the BGA contacts 16 on board 10 and, above and surrounding module 20b, chip module 20c having PGA connectors 22 may be received at PGA contacts 14 at the same site on board 10. In this instance, electrical leads 25 connected to contacts 16 are not connected to corresponding leads 27 connected to contacts 14.

Figures 4, 5, 6:
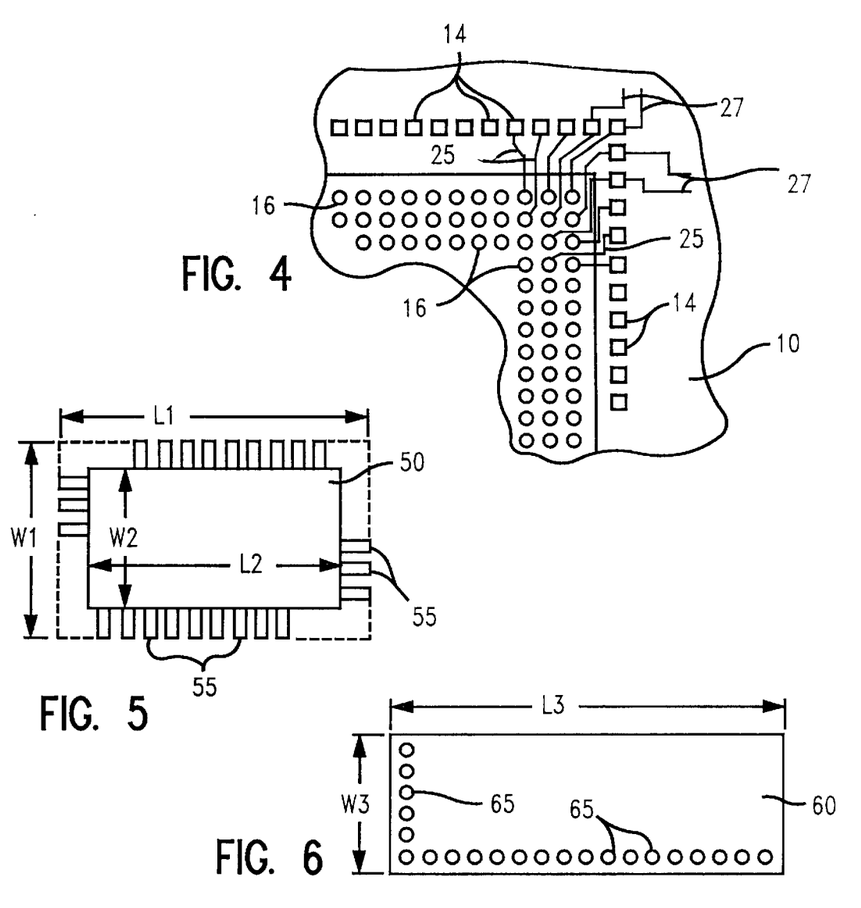
FIG. 4 is a portion of the chip module site of FIG. 1 showing the circuit board wiring.
FIG. 5 is a top plan view of a flat pack chip module having PGA connectors.
FIG. 6 is a top plan view of a flat pack chip module having BGA connectors.

In the embodiment wherein multiple chip modules are not to be mounted and received simultaneously at a chip site, the corresponding contacts in each set of contact configurations at the chip site may be prewired to common signals. As shown in FIG. 4, circuit board 10 contains a first set of PGA contacts 14 and a second set of BGA contacts 16 at the same chip site. Electrical connectors 25, for example, fusible links, are provided between each PGA contact 14 and its corresponding BGA contact 16. System electrical connections 27 then connect each of the PGA/BGA contacts to the remainder of the system (not shown). The system wires 27 provide electrical path to other components, power or connectors, for example. Instead of direct electrical connections, zero-ohm resistors may connect common signals. Alternatively, the sites may be prewired to independent or different signals such that the same board could be used for two different applications, such as two different microprocessor implementations. This may be used to permit two different microprocessors to operate independently, or to communicate with each other.

The invention may also be used to connect memory chips at the same site on a circuit board having the same or different connector arrangement and configuration, for example to provide expanded memory. In FIG. 5, there is shown a flat pack SRAM chip module having a plurality of pins 55 extending around the periphery of the module. The total length of the chip module including the pins is given as $L_1$ while the total width of the chip module including the pins is given as $W_1$. The length of the chip module itself, without the pins, is shown as $L_2$ and the width of the chip module itself, without the pins, is shown as $W_2$.

In FIG. 6, there is shown a flat pack SRAM chip module 60 having a BGA connectors 65. The BGA connectors are disposed within the periphery of the chip module 60 itself and do not extend beyond the periphery as in the PGA device shown in FIG. 5. The overall length of the BGA chip module 60 is shown as $L_3$ and the overall width as $W_3$.

Figure 7:
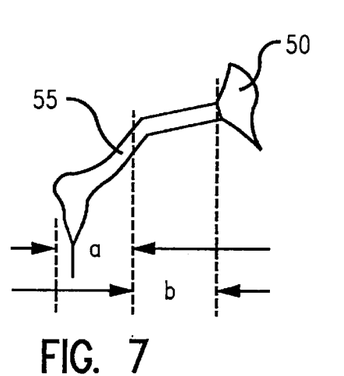
FIG. 7 is a side elevational view of the pin connectors of FIG. 5.

In FIG. 7, there is shown the pin extension of the device depicted in FIG. 5. The pins 55 extend first generally outward and then down. The length of the portion of pin 55 that extends outward is shown as b, and the length of the portion of the 55 extending downward is shown as a. Accordingly, when designing a chip site which can utilize either PGA chip 50 or BGA chip 60, one may configure the size of the BGA chip to extend under the portion of length b of pin 55.

Figure 8:
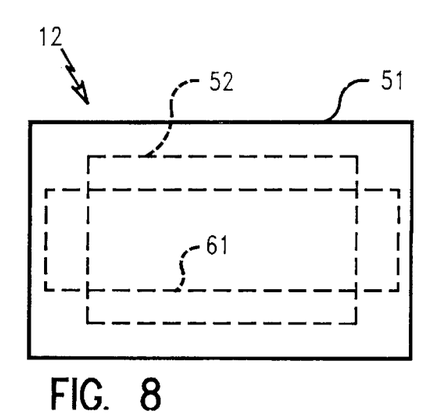
FIG. 8 is a top plan view showing the super position of the BGA flat pack of FIG. 6 on the PGA flat pack of FIG. 5 at a chip module site.

In FIG. 8, there is shown superimposed the periphery of the contacts 51 to receive PGA chip module 50 and the periphery 61 of BGA chip 60. Accordingly, the length $L_3$ of BGA chip 60 may equal $L_2+2b$ and the width of the chip 60 $W_3$ may equal $W_2+2b$. The periphery 61 of chip 60 extends outward beyond at least a portion of the periphery 52 of chip 50 and under a portion of pins 55. Thus the BGA chip may utilize the added area which extends under length b of PGA pin 55 for expansion.

Accordingly, the present invention then provides a circuit board for receiving different chip modules at the same chip module-receiving site which may be easily manufactured at low cost.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A carrier for receiving at least three different chip modules having electrical connectors at a chip module site comprising:

a first set of contacts at the chip module site having a first module contact arrangement for receiving a chip module having an electrical connector footprint corresponding in size and shape directly to the first module contact arrangement;

a second set of contacts at said chip module site having a second module contact arrangement for receiving a chip module having an electrical connector footprint corresponding in size and shape directly to the second module contact arrangement; and, a third set of contacts at said chip module site having a third module contact arrangement for receiving a chip module having an electrical connector footprint corresponding in size and shape directly to the third module contact arrangement.

2. The carrier of claim 1 wherein said second set of contacts is electrically connected to said first set of contacts.

3. The carrier of claim 1 further including an additional set of contacts at said chip module site having a different arrangement than said first, second, and third contacts, and being electrically connected to said first set of contacts for receiving a chip module having an electrical connector footprint conforming thereto.

4. The carrier of claim 1 wherein said second set of contacts has a different arrangement than said first set of contacts.

5. The carrier of claim 1 wherein fusible links are electrically connected between said first, second, and third sets of contacts.

6. The carrier of claim 1 further including a chip module having an electrical connector footprint conforming to the first module contact arrangement and in physical and electrical contact with said first set of contacts, said chip module electrical connectors being out of physical contact with said second and third set of contacts.

7. A carrier for receiving at least three different chip modules having electrical connectors at a chip module site comprising:

a first set of contacts at the chip module site having a first module contact arrangement for receiving a chip module having an electrical connector footprint conforming to the first module contact arrangement;

a second set of contacts at said chip module site having a second module contact arrangement for receiving a chip module having an electrical connector footprint conforming to the second module contact arrangement; and, a third set of contacts at said chip module site having a third module contact arrangement for receiving a chip module having an electrical connector footprint conforming to the third module contact arrangement;

wherein said second set of contacts surrounds said first set of contacts.

8. A carrier for receiving at least three different chip modules having electrical connectors at a chip module site comprising:

a first set of contacts at the chip module site having a first module contact arrangement for receiving a chip module having an electrical connector footprint conforming to the first module contact arrangement;

a second set of contacts at said chip module site having a second module contact arrangement for receiving a chip module having an electrical connector footprint conforming to the second module contact arrangement; and, a third set of contacts at said chip module site having a third module contact arrangement for receiving a chip module having an electrical connector footprint conforming to the third module contact arrangement;

wherein said second set of contacts are of a different configuration than said first set of contacts, and said first set of contacts are of a different configuration than said third set of contacts.

9. A carrier for receiving at least three different chip modules having electrical connectors at a chip module site comprising:

a first set of contacts at the chip module site having a first module contact arrangement for receiving a chip module having an electrical connector footprint conforming to the first module contact arrangement;

a second set of contacts at said chip module site having a second module contact arrangement for receiving a chip module having an electrical connector footprint conforming to the second module contact arrangement; and, a third set of contacts at said chip module site having a third module contact arrangement for receiving a chip module having an electrical connector footprint conforming to the third module contact arrangement;

wherein said first set of contacts has a configuration chosen from the group consisting of BGA, micro BGA, CGA, PGA and direct die attachment, said second set of contacts has a configuration chosen from the group consisting of BGA, micro BGA, CGA, PGA and direct die attachment, but of a different configuration than said first set of contacts, and said third set of contacts has a configuration chosen from the group consisting of BGA, micro BGA, CGA, PGA and direct die attachment, but of a different configuration than said first and second set of contacts.

10. A circuit board and chip module combination comprising:

a circuit board having a site for receiving a chip module having electrical connectors thereon;

a first set of PGA contacts arranged near the periphery of said chip module site;

a second set of contacts having a configuration selected from the group consisting of BGA, micro BGA, CGA and direct die attachment contacts arranged within said first set of contacts at said chip module site;

a first chip module having PGA connectors conforming to the first PGA contact arrangement and in physical and electrical connection with said first set of PGA contacts, said first chip module electrical connectors being out of physical contact with said second set of contacts; and a second chip module having connectors conforming to the second contact arrangement and in physical and electrical connection with said second set of contacts, said second chip module electrical connectors being out of physical contact with said first set of contacts.

11. The combination of claim 10 wherein the PGA connectors of said first chip module extend outward from the periphery of said first chip module, and wherein said second chip module is disposed between said first chip module and said circuit board and extends outward beyond the periphery of said first chip module.

12. A method of attaching at least three different chip modules having electrical connectors at a chip module site on a carrier comprising the steps of:

a) providing a carrier having a first set of contacts at a chip module site with a first module contact arrangement for receiving a chip module having an electrical connector footprint corresponding in size and shape directly to the first module contact arrangement;

a second set of contacts at said chip module site having a second module contact arrangement for receiving a chip module having an electrical connector footprint corresponding directly to the second module contact arrangement; and, a third set of contacts at said chip module site having a third module contact arrangement for receiving a chip module having an electrical connector footprint corresponding in size and shape directly to the third module contact arrangement b) providing a chip module having an electrical connector footprint corresponding in size and shape directly to the first module contact arrangement; and c) placing said chip module in physical and electrical contact with said first set of contacts, said chip module electrical connectors being out of physical contact with said second and third set of contacts, said second set of contacts being available for receiving a second chip module having an electrical connector footprint corresponding in size and shape directly to the second module contact arrangement, and said third set of contacts being available for receiving a third chip module having an electrical connector footprint corresponding in size and shape directly to the third module contact arrangement.

13. The method of claim 12 including the step of electrically connecting said second set of contacts to said first set of contacts.

14. The method of claim 12 further including the step of providing an additional set of contacts at said chip module site having a different arrangement than said first and second contacts, and being electrically connected to said first set of contacts for receiving a chip module having an electrical connector footprint conforming thereto.

15. The method of claim 12 further including the step of providing said second set of contacts with a different arrangement than said first set of contacts and said third set of contacts with a different arrangement than said first and second set of contacts.

16. The method of claim 12 further including the step of providing fusible links as electrical connections between said first, second, and third sets of contacts.

17. The method of claim 12 further including the steps of:

d) providing a second chip module having an electrical connector footprint conforming to the second module contact arrangement; and e) placing said second chip module in physical and electrical contact with said second set of contacts, said chip module electrical connectors being out of physical contact with said first set of contacts.

18. The method of claim 17 including the step of electrically connecting said second set of contacts to said first set of contacts.

19. A method of attaching at least three different chip modules having electrical connectors at a chip module site on a carrier comprising the steps of:

a) providing a carrier having a first set of contacts at a chip module site with a first module contact arrangement for receiving a chip module having an electrical connector footprint conforming to the first module contact arrangement;

a second set of contacts at said chip module site having a second module contact arrangement for receiving a chip module having an electrical connector footprint conforming to the second module contact arrangement, providing that said second set of contacts surrounds said first set of contacts; and, a third set of contacts at said chip module site having a third module contact arrangement for receiving a chip module having an electrical connector footprint conforming to the third module contact arrangement;

b) providing a chip module having an electrical connector footprint conforming to the first module contact arrangement; and c) placing said chip module in physical and electrical contact with said first set of contacts, said chip module electrical connectors being out of physical contact with said second and third set of contacts, said second set of contacts being available for receiving a second chip module having an electrical connector footprint conforming to the second module contact arrangement, and said third set of contacts being available for receiving a third chip module having an electrical connector footprint conforming to the third module contact arrangement.

20. A method of attaching at least three different chip modules having electrical connectors at a chip module site on a carrier comprising the steps of:

a) providing a carrier having a first set of contacts at a chip module site with a first module contact arrangement for receiving a chip module having an electrical connector footprint conforming to the first module contact arrangement;

a second set of contacts at said chip module site having a second module contact arrangement for receiving a chip module having an electrical connector footprint conforming to the second module contact arrangement; and, a third set of contacts at said chip module site having a third module contact arrangement for receiving a chip module having an electrical connector footprint conforming to the third module contact arrangement;

b) providing a chip module having an electrical connector footprint conforming to the first module contact arrangement; and c) placing said chip module in physical and electrical contact with said first set of contacts, said chip module electrical connectors being out of physical contact with said second and third set of contacts, said second set of contacts being available for receiving a second chip module having an electrical connector footprint conforming to the second module contact arrangement, and said third set of contacts being available for receiving a third chip module having an electrical connector footprint conforming to the third module contact arrangement; and, d) providing said first set of contacts with a configuration chosen from the group consisting of BGA, micro BGA, CGA, PGA and direct die attachment, said second set of contacts with a configuration chosen from the group consisting of BGA, micro BGA, CGA, PGA and direct die attachment, but of a different configuration than said first set of contacts, and said third set of contacts with a configuration chosen from the group consisting of BGA, micro BGA, CGA, PGA and direct die attachment, but of a different configuration than said first and second set of contacts.

21. A carrier for receiving chip modules having different sizes and shapes, and electrical connectors at a chip module site comprising:

a first set of contacts at the chip module site having a first module contact arrangement for receiving a chip module having an electrical connector footprint conforming to the first module contact arrangement; and a second set of contacts at said chip module site having a second module contact arrangement different from the first module contact arrangement for receiving a chip module having an electrical connector footprint conforming to the second module contact arrangement;

wherein said first set of contacts comprises a surface mount configuration, and said second set of contacts comprises a surface mount configuration but of a different configuration than said first set of contacts.

22. The carrier of claim 21 wherein said second set of contacts is electrically connected to said first set of contacts.

23. The carrier of claim 21 further including an additional set of contacts at said chip module site having a different arrangement than said first and second contacts, and being electrically connected to said first set of contacts for receiving a chip module having an electrical connector footprint conforming thereto.

24. The carrier of claim 21 wherein fusible links are electrically connected between said first and second sets of contacts.

25. The carrier of claim 21 further including a chip module having an electrical connector footprint conforming to the first module contact arrangement and in physical and electrical contact with said first set of contacts, said chip module electrical connectors being out of physical contact with said second set of contacts.

26. A carrier for receiving chip modules having different sizes and shapes, and electrical connectors at a chip module site comprising:

a first set of contacts at the chip module site having a first module contact arrangement for receiving a chip module having an electrical connector footprint conforming to the first module contact arrangement;

a second set of contacts at said chip module site having a second module contact arrangement different from the first module contact arrangement for receiving a chip module having an electrical connector footprint conforming to the second module contact arrangement; and, an additional set of contacts at said chip module site having a different arrangement than said first and second contacts, and being electrically connected to said first set of contacts for receiving a chip module having an electrical connector footprint conforming thereto.

27. A method of attaching different chip modules having different sizes and shapes, and electrical connectors at a chip module site on a carrier comprising the steps of:

a) providing a carrier having a first set of contacts at a chip module site with a first module contact arrangement for receiving a chip module having an electrical connector footprint conforming to the first module contact arrangement; and a second set of contacts at said chip module site having a second module contact arrangement different from the first module contact arrangement for receiving a chip module having an electrical connector footprint conforming to the second module contact arrangement;

b) providing a chip module having an electrical connector footprint conforming to the first module contact arrangement;

c) placing said chip module in physical and electrical contact with said first set of contacts, said chip module electrical connectors being out of physical contact with said second set of contacts, said second set of contacts being available for receiving a second chip module having an electrical connector footprint conforming to the second module contact arrangement; and, d) providing an additional set of contacts at said chip module site having a different arrangement than said first and second contacts, and being electrically connected to said first set of contacts for receiving a chip module having an electrical connector footprint conforming thereto.

28. A method of attaching different chip modules having different sizes and shapes, and electrical connectors at a chip module site on a carrier comprising the steps of:

a) providing a carrier having a first set of contacts at a chip module site with a first module contact arrangement for receiving a chip module having an electrical connector footprint conforming to the first module contact arrangement; and a second set of contacts at said chip module site having a second module contact arrangement different from the first module contact arrangement for receiving a chip module having an electrical connector footprint conforming to the second module contact arrangement;

b) providing a chip module having an electrical connector footprint conforming to the first module contact arrangement;

c) placing said chip module in physical and electrical contact with said first set of contacts, said chip module electrical connectors being out of physical contact with said second set of contacts, said second set of contacts being available for receiving a second chip module having an electrical connector footprint conforming to the second module contact arrangement;

d) providing a second chip module having an electrical connector footprint conforming to the second module contact arrangement; and, e) placing said second chip module in physical and electrical contact with said second set of contacts, said chip module electrical connectors being out of physical contact with said first set of contacts.

29. A method of attaching different chip modules having different sizes and shapes, and electrical connectors at a chip module site on a carrier comprising the steps of:

a) providing a carrier having a first set of contacts at a chip module site with a first module contact arrangement for receiving a chip module having an electrical connector footprint conforming to the first module contact arrangement; and a second set of contacts at said chip module site having a second module contact arrangement different from the first module contact arrangement for receiving a chip module having an electrical connector footprint conforming to the second module contact arrangement;

b) providing a chip module having an electrical connector footprint conforming to the first module contact arrangement;

c) placing said chip module in physical and electrical contact with said first set of contacts, said chip module electrical connectors being out of physical contact with said second set of contacts, said second set of contacts being available for receiving a second chip module having an electrical connector footprint conforming to the second module contact arrangement;

d) providing a second chip module having an electrical connector footprint conforming to the second module contact arrangement;

e) placing said second chip module in physical and electrical contact with said second set of contacts, said chip module electrical connectors being out of physical contact with said first set of contacts; and, f) electrically connecting said second set of contacts to said first set of contacts.

* * * * *